United States Patent [19]
Shirai

[11] Patent Number: 5,905,647
[45] Date of Patent: May 18, 1999

[54] INVERTER WITH INCORPORATED FILTER CIRCUIT AND IMPROVED COMPONENT COOLING ARRANGEMENT

[75] Inventor: Seiichi Shirai, Yokkaichi, Japan

[73] Assignees: Kabushiki Kaisha Toshiba, Japan; Schneider Electric.S.A., France

[21] Appl. No.: 09/001,586

[22] Filed: Dec. 31, 1997

[30] Foreign Application Priority Data

Jan. 20, 1997 [JP] Japan .................................. 9-007513
Jan. 24, 1997 [JP] Japan .................................. 9-010991

[51] Int. Cl.$^6$ ................................................. H02M 7/44
[52] U.S. Cl. ............................. 363/141; 363/147; 363/44
[58] Field of Search .................................. 363/141, 147, 363/146, 37, 44, 47, 48

[56] References Cited

U.S. PATENT DOCUMENTS 4,070,701  1/1978  Harnden, Jr. et al. ...................... 363/25
4,849,950  7/1989  Sugiura et al. ............................ 363/48

*Primary Examiner*—Shawn Riley
*Attorney, Agent, or Firm*—Limbach & Limbach LLP

[57] ABSTRACT

An inverter includes an inverter circuit, a rectifier circuit, a filter circuit including an input side capacitor, a coil, and an output side capacitor, the filter circuit being disposed at a front stage of the rectifier circuit, a casing accommodating the inverter circuit, the rectifier circuit and the filter circuit, a first cooling chamber defined in the casing, a second cooling chamber defined in the casing and partitioned by a partition wall from the first cooling chamber so as to be adjacent to it, a plurality of vent holes formed in the partition wall, and a fan for supplying a cooling air into the first cooling chamber and further via the vent holes into the second cooling chamber. The inverter circuit is cooled by the cooling air flowing into the first cooling chamber and the coil of the filter circuit is cooled by the cooling air flowing through the second cooling chamber.

14 Claims, 16 Drawing Sheets

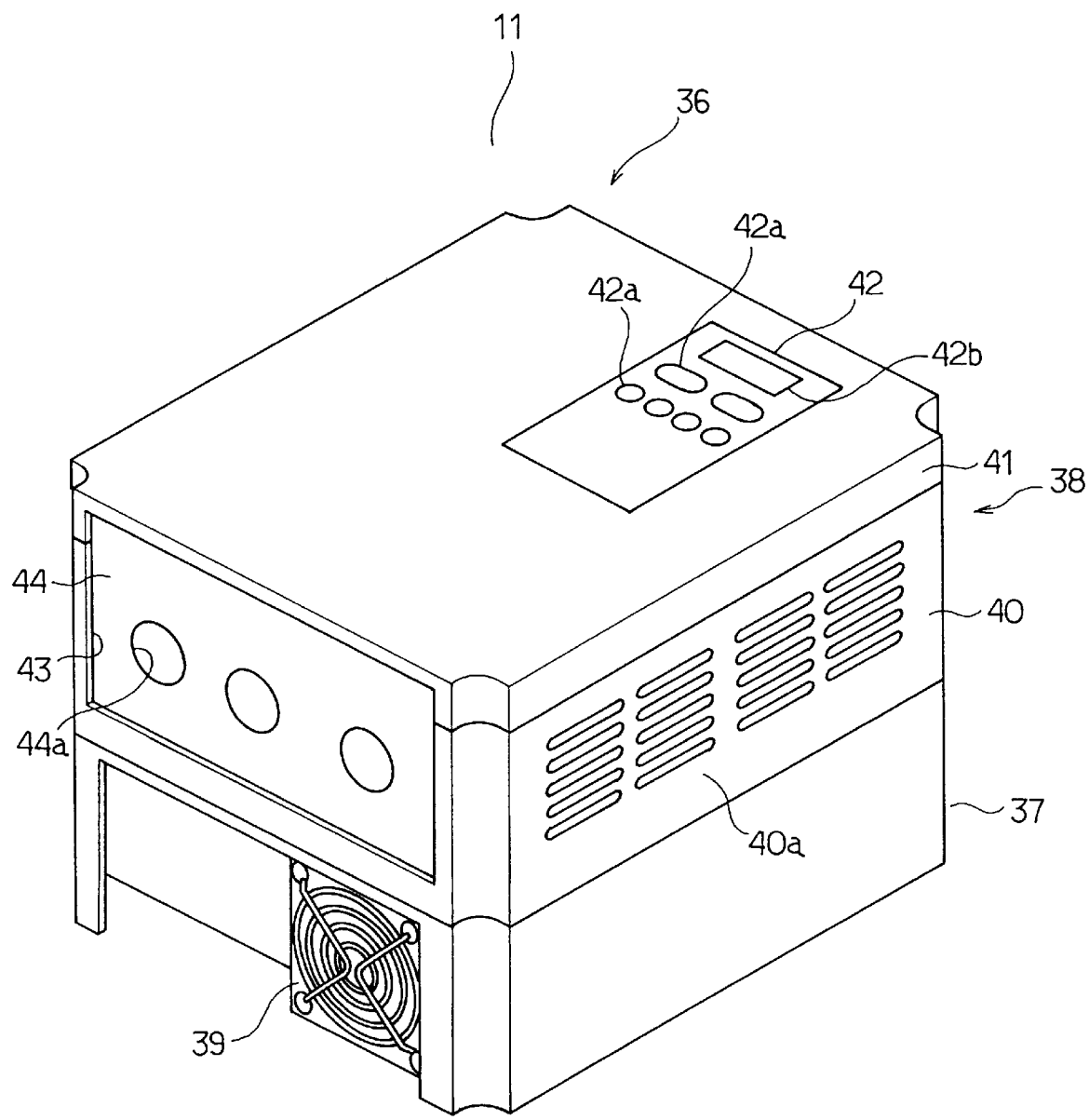
F I G. 6

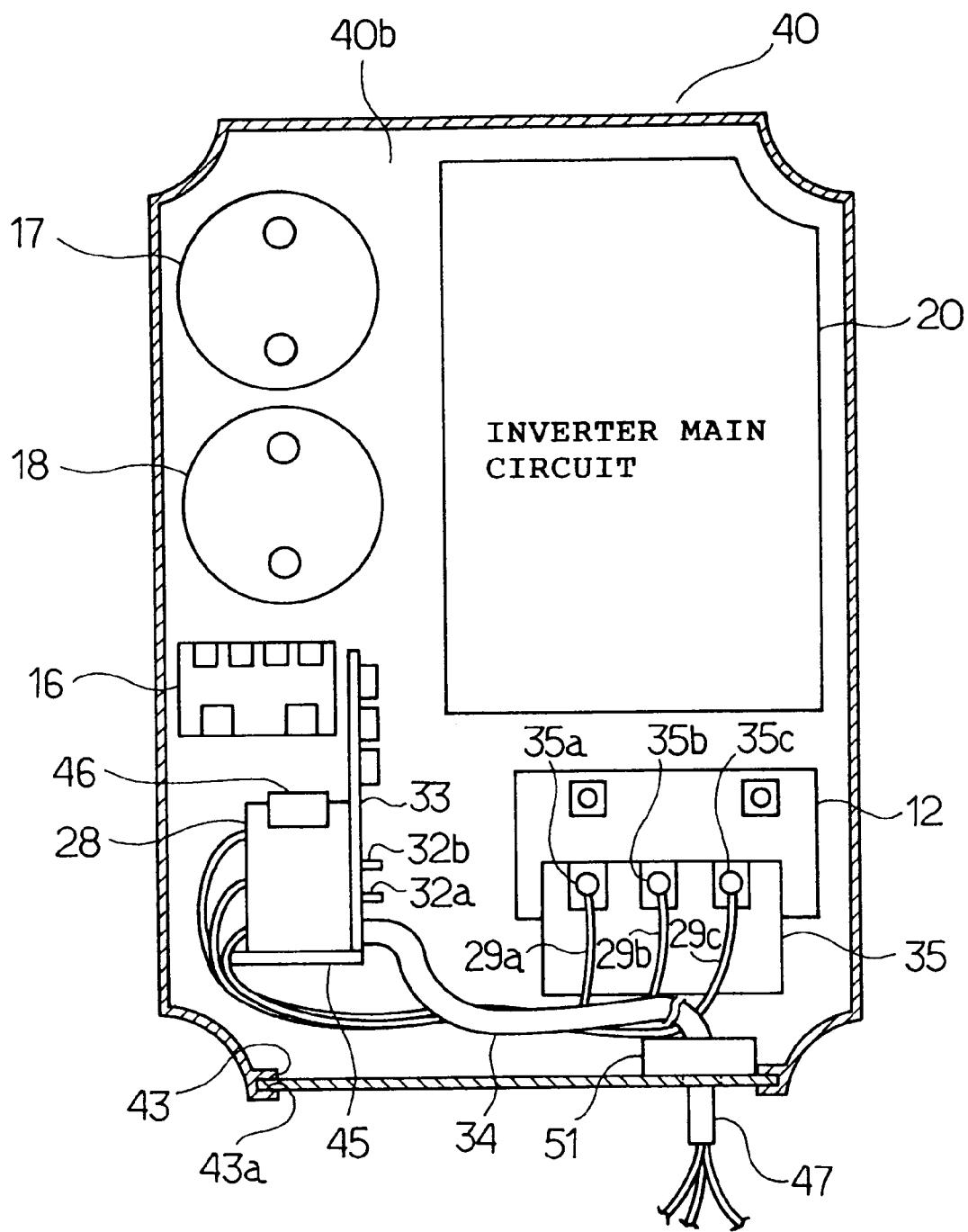
F I G. 9

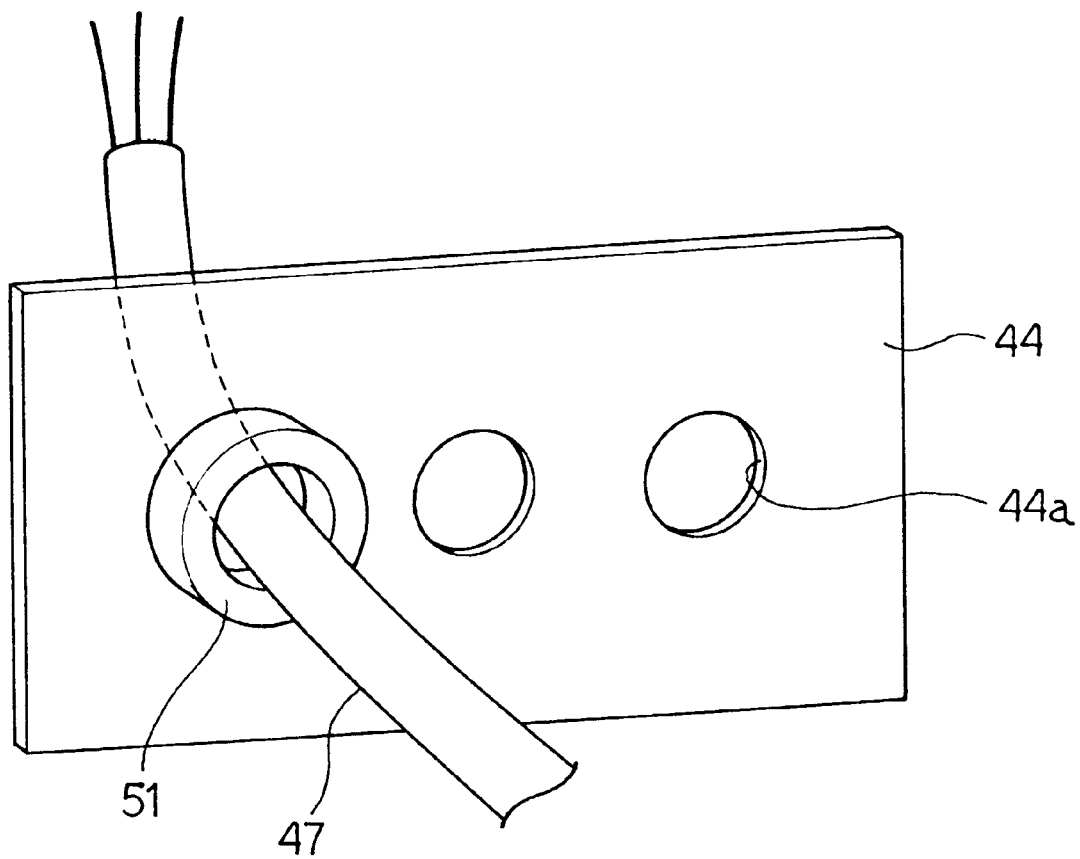
F I G. 10

INVERTER WITH INCORPORATED FILTER CIRCUIT AND IMPROVED COMPONENT COOLING ARRANGEMENT

BACKGROUND OF THE INVENTION

1. Field of the Invention

This invention relates generally to an inverter including an inverter circuit developing a variable-voltage, variable-frequency source, and more particularly, to such an inverter provided with a filter circuit for reducing electrical noise and a cooling arrangement for cooling components including the filter circuit.

2. Description of the Prior Art

A switching operation of an inverter circuit accompanies electrical noise in the inverters of the above-described type. The noise sometimes causes malfunction of equipment disposed around the inverter, such as acoustic equipment. In view of this problem, a filter circuit is conventionally provided at the power supply side of the inverter to eliminate the electrical noise. FIG. 18 illustrates an example of such conventional inverter. As shown, the inverter 1 comprises a single casing 4 accommodating therein a rectifier circuit 2, an inverter circuit 3, etc. A discrete, exterior type filter circuit 5 is connected between a power supply and the inverter 1.

The inverter 1 including the discrete filter circuit 5 necessitates a large installation space when the filter circuit 5 is provided independent of the inverter 1. Furthermore, a wire connecting the filter circuit 5 to the rectifier circuit 2 and the inverter circuit 3 has an increased length and is exposed in the exterior of the casing 4. As a result, radiation noise is emitted from the wire 6. In recent years, the filter 5 has been used with the inverter in a larger number of cases so that environment around the inverter can be prevented from being adversely affected. For the above-described reasons, the filter circuit 5 is desired to be accommodated in the casing 4 together with the rectifier circuit 2, the inverter circuit 3, etc. so that the inverter is compacted.

However, when the conventional filter circuit 5 is accommodated in the casing of the inverter, the casing would become considerably larger than the conventional casing 4. Moreover, the filter circuit 5 or particularly, coils thereof generate a large amount of heat. Accordingly, an amount of heat generated in the casing is increased when the filter circuit 5 is accommodated in the casing together with the inverter circuit 3 etc. Consequently, an arrangement for sufficiently cooling the filter circuit 5 accommodated in the casing 4 is required in addition to the conventional cooling arrangement for the rectifier circuit 2, the inverter circuit 3, etc.

SUMMARY OF THE INVENTION

Therefore, an object of the present invention is to provide an inverter in which the inverter circuit, the rectifier circuit and the filter circuit can be accommodated in a single casing, and the size of which can be rendered as small as possible.

Another object of the invention is to provide an inverter in which the inverter circuit, the rectifier circuit, and the filter circuit can be accommodated in a single casing and these components can sufficiently be cooled.

The present invention provides an inverter comprising a rectifier circuit, an inverter circuit, an input side printed circuit board, an output side printed circuit board, a filter circuit, including an input side capacitor mounted on the input side printed circuit board, a coil, and an output side capacitor mounted on the output side printed circuit board, the filter circuit being disposed at a front stage of the rectifier circuit, the coil having an input side end and an output side end both extending in directions differing from each other, one of the input and output side ends of the coil being formed into the shape of a pin, the other end being formed into the shape of a wire by extending a wire material of the coil, and a casing accommodating the rectifier circuit, the inverter circuit and the filter circuit.

In the prior art, a wire connecting between the filter circuit and the rectifier circuit is rendered longer and is exposed outside the casing when the filter circuit is provided independent of the casing accommodating the inverter circuit and the rectifier circuit. Consequently, the radiation noise is produced from the connecting wire. Conductive noise returning to the power supply side needs to be restrained so that the noise produced from the wire is reduced. For this purpose, a high performance and accordingly, expensive, large-sized filter circuit is required.

According to the inverter of the present invention, the connecting wire between the filter circuit and the rectifier circuit can be reduced in the length, and the filter circuit is accommodated in the casing together with the rectifier circuit and the inverter circuit. Consequently, the radiation noise produced from the connecting wire between the filter circuit and the rectifier circuit can be reduced. Since the conductive noise need not be reduced, the filter circuit can be rendered smaller in size. Thus, the size of the inverter can be reduced even when the filter circuit is accommodated in the casing together with the rectifier circuit and the inverter circuit.

The coil has the input side end and the output side end both extending in directions differing from each other. In this case, the input and output side capacitors are separated in the different directions with the coil disposed therebetween. Since superimposition of noise from the output side to the input side of the filter circuit is prevented, the filter circuit and accordingly, the inverter can be rendered smaller in size.

Furthermore, the pin-shaped end can readily be connected to the corresponding circuit board. Since the other end is formed into the shape of the wire, the input and output side circuit boards can readily be separated from each other. Furthermore, the disposition of the filter circuit can optionally be changed according to an accommodation space in the casing.

The filter circuit and the rectifier circuit can be connected together without using a wire when the output side printed circuit board is integrally mounted on the rectifier circuit. Consequently, the noise can further be reduced.

The inverter preferably further comprises an annular core for a zero phase inductor. In this case, any one of a power supply wire connected to the input side printed circuit board, a wire or wires connecting between the input and output side printed circuit boards, and an output wire connected to the output side printed circuit board passes through the core. This arrangement of the core can reduce noise produced in a section between the power supply wire and the output wire.

The inverter preferably further comprises a coil casing for accommodating the coil. In this case, the core is accommodated in the coil casing. Alternatively, when the casing has a through hole through which the power supply wire or the output wire extending from the inverter circuit passes, the core is disposed in the casing so as to correspond with the hole of the casing. The casing preferably has a claw for fixing the coil casing thereto.

The invention also provides an inverter comprising a rectifier circuit, an inverter circuit, a filter circuit including an input side capacitor, a coil and an output side capacitor, the filter circuit being disposed at a front stage of the rectifier circuit, a casing accommodating the rectifier circuit, the inverter circuit and the filter circuit, a first cooling chamber defined in the casing, a second cooling chamber defined in the casing and partitioned by a partition wall from the first cooling chamber to be adjacent thereto, a plurality of vent holes formed in the partition wall, and a fan for supplying a cooling air into the first cooling chamber and further via the vent holes into the second cooling chamber. The inverter circuit is cooled by the cooling air flowing into the first cooling chamber and the coil of the filter circuit is cooled by the cooling air flowing through the second cooling chamber.

In this constitution, the inverter circuit is cooled by the cooling air flowing into the first cooling chamber and the coil of the filter circuit is cooled by the cooling air flowing in the second cooling chamber. Since the filter circuit, the rectifier circuit and the inverter circuit are integrally provided in the casing, the inverter circuit and the filter circuit can efficiently be cooled by the cooling air supplied into the first and second cooling chamber by the fan. The guide member is preferably provided for guiding the cooling air supplied from the fan into the second cooling chamber. The guide member is desirably disposed in the vicinity of any one of the vent holes at a side of the partition wall facing the first cooling chamber.

The invention provides an inverter comprising a rectifier circuit, an inverter circuit, a filter circuit including an input side capacitor, a coil, and an output side capacitor, the filter circuit being disposed at a front stage of the rectifier circuit, a cooling casing having a first cooling chamber and a second cooling chamber partitioned by a partition wall to be adjacent each other, the partition wall having a plurality of vent holes, and a fan for supplying a cooling air into the first cooling chamber and further via the vent holes into the second cooling chamber so that the inverter circuit is cooled by the cooling air flowing into the first cooling chamber and the coil of the filter circuit is cooled by the cooling air flowing throught the second cooling chamber.

BRIEF DESCRIPTION OF THE DRAWINGS

Other objects, features and advantages of the present invention will become clear upon reviewing the following description of preferred embodiments thereof, made with reference to the accompanying drawings, in which:

FIG. 6 is a perspective view of a casing of the inverter;

FIG. 9 is a view similar to FIG. 1, showing the inverter of a second embodiment in accordance with the present invention;

FIG. 10 is a perspective view showing a metal plate and a power supply wire extending through a hole of the sheet metal and the core for the zero phase inductor;

DETAILED DESCRIPTION OF THE PREFERRED EMBODIMENTS

A first embodiment of the present invention will be described with reference to FIGS. 1 to 8. In the first embodiment, the invention is applied to a large-sized inverter having a current capacity ranging between 5.5 and 15 kW.

Figure 8:
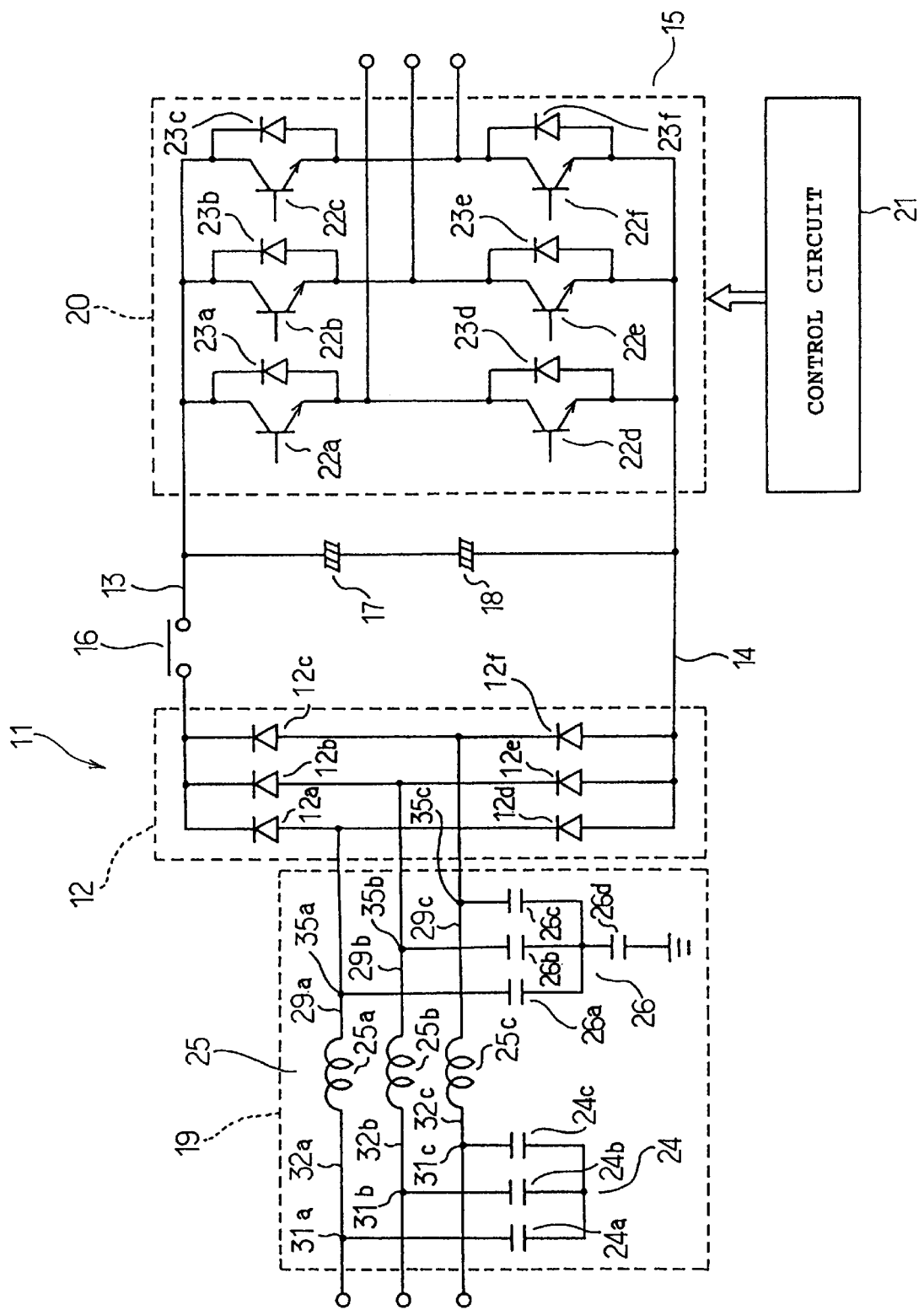
FIG. 8 is a schematic circuit diagram showing an electrical arrangement of the inverter.

Referring first to FIG. 8, an electrical arrangement of an inverter 11 of the first embodiment is schematically shown. The inverter 11 is accommodated in a casing 36 (see FIG. 6). A rectifier circuit 12 is connected via DC buses 13 and 14 to an inverter circuit 15. Normally open contacts of a relay 16 are connected to the DC bus 13. Two smoothing main circuit capacitors 17 and 18 are connected between the DC buses 13 and 14. A filter circuit 19 is provided at a front stage of the rectifier circuit 12.

The rectifier circuit 12 comprises six three-phase bridge-connected diodes 12a to 12f. These diodes 12a to 12f are assembled into, for example, a rectangular package (not shown) in the embodiment. The inverter circuit 15 comprises an inverter main circuit 20 and a control circuit 21 for controlling a switching operation of the inverter main circuit 20. The inverter main circuit 20 comprises six transistors 22a to 22f serving as switching elements and feedback diodes 23a to 23f for processing invalid currents. The transistors 22a to 22f and the feedback diodes 23a to 23f are three-phase bridge-connected between the DC buses 13 and 14. The inverter main circuit 20 is assembled into a substantially rectangular package in the embodiment. The filter circuit 19 comprises an input side capacitor circuit 24 including three capacitors 24a to 24c, a zero phase reactor (common mode core reactor) including three-phase coils 25a to 25c, and an output side capacitor circuit 26 including four capacitors 26a to 26d.

Figure 2:
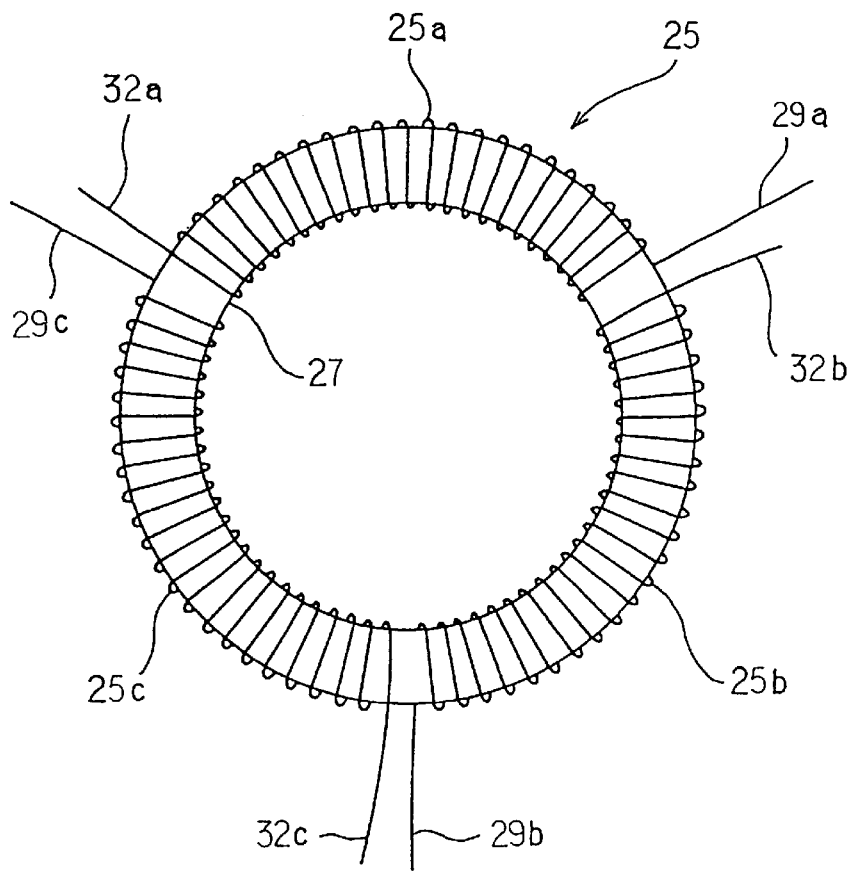
FIG. 2 is a plan view of a zero phase reactor.
Figure 3:
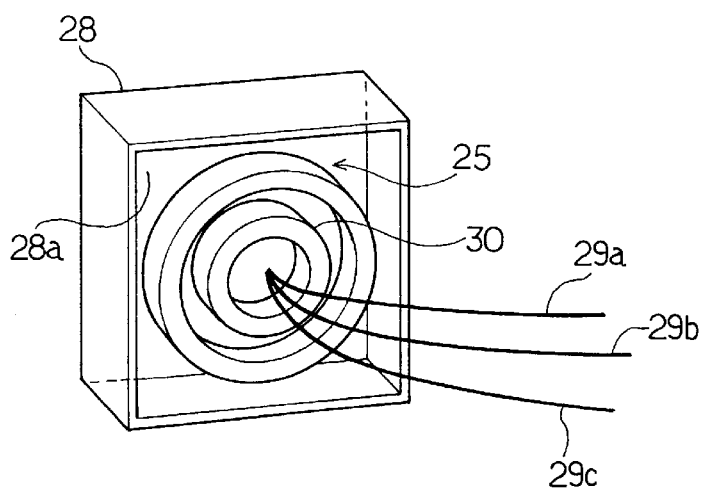
FIG. 3 is a perspective view of a coil casing accommodating cores for the zero phase reactor and a zero phase inductor.

The zero phase reactor 25 includes a core 27 on which the three-phase coils 25a to 25c are wound as shown in FIG. 2. The zero phase reactor 25 is accommodated in a rectangular coil casing 28 having a front opening as viewed in FIG. 3. The zero phase reactor 25 is fixed to a bottom 28a of the coil casing 28 by a resin, for example. Output side ends 29a to 29c of the coils 25a to 25c extend outward through an opening of the coil casing 28. Each of the output side ends 29a to 29c is formed into the shape of a wire by extending a wire material of the respective coil. In FIG. 3, the coils 25a to 25c of the zero phase reactor 25 are eliminated.

Figure 4:
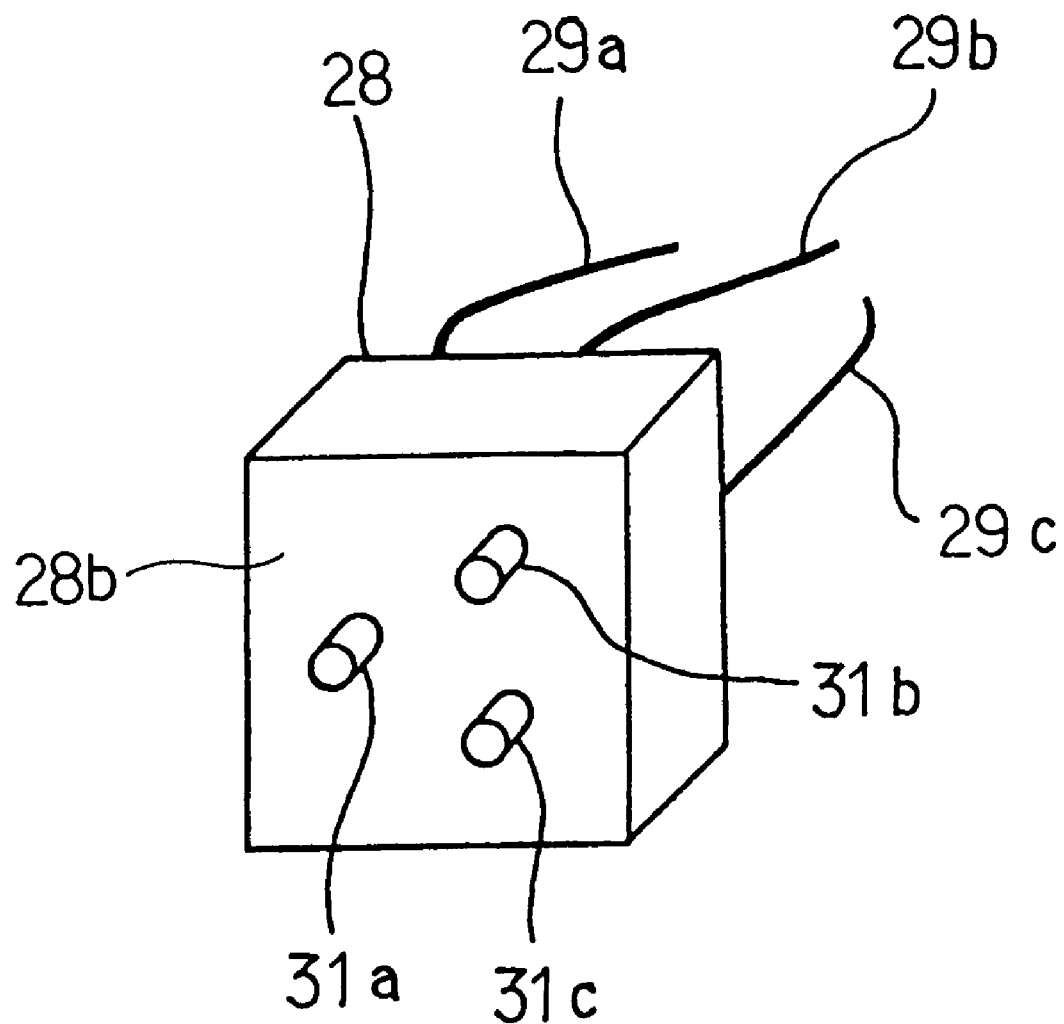
FIG. 4 is a perspective view of the coil casing as viewed from the rear.

An annular core 30 for a zero phase inductor is provided in the coil casing 28 to be located inside the zero phase reactor 25. The output side ends 29a to 29c pass through the zero phase inductor core 30. In FIG. 3, the positions of the output side ends 29a to 29c thereof in the coil casing 28 are simplified for the purpose of typically showing the positional relation between the ends and the zero phase inductor core 30. Pin terminals 31a to 31c project from a rear face 28b of the coil casing 28, as shown in FIG. 4. Input side ends 32a to 32c (see FIG. 2) of the coils 25a to 25c are connected to the pin terminals 31a to 31c respectively. Accordingly, the input side ends 32a to 32c and output side ends 29a to 29c of the respective coils 25a to 25c extend in the directions differing from each other.

Figure 5:
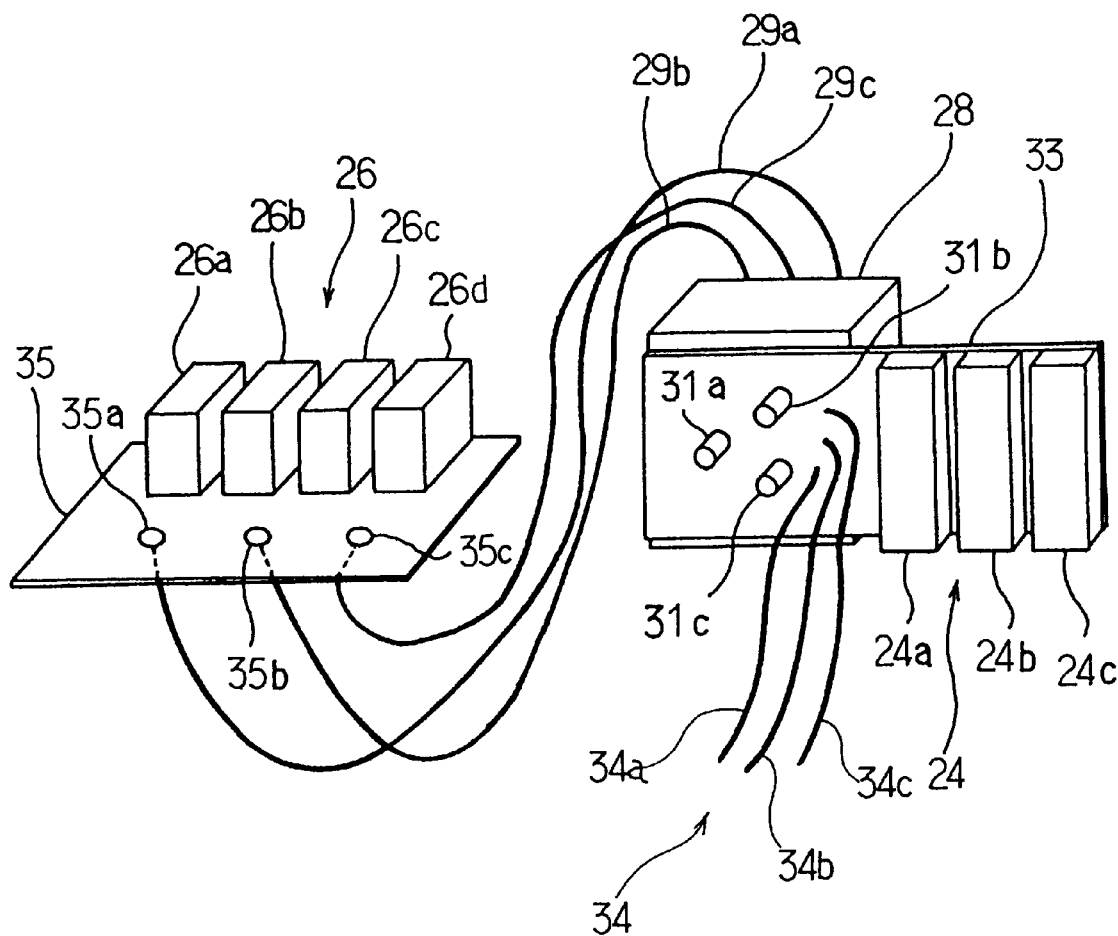
FIG. 5 is a perspective view showing wiring connection of an input side printed circuit board, the zero phase reactor, and an output side printed circuit board.
Figure 7:
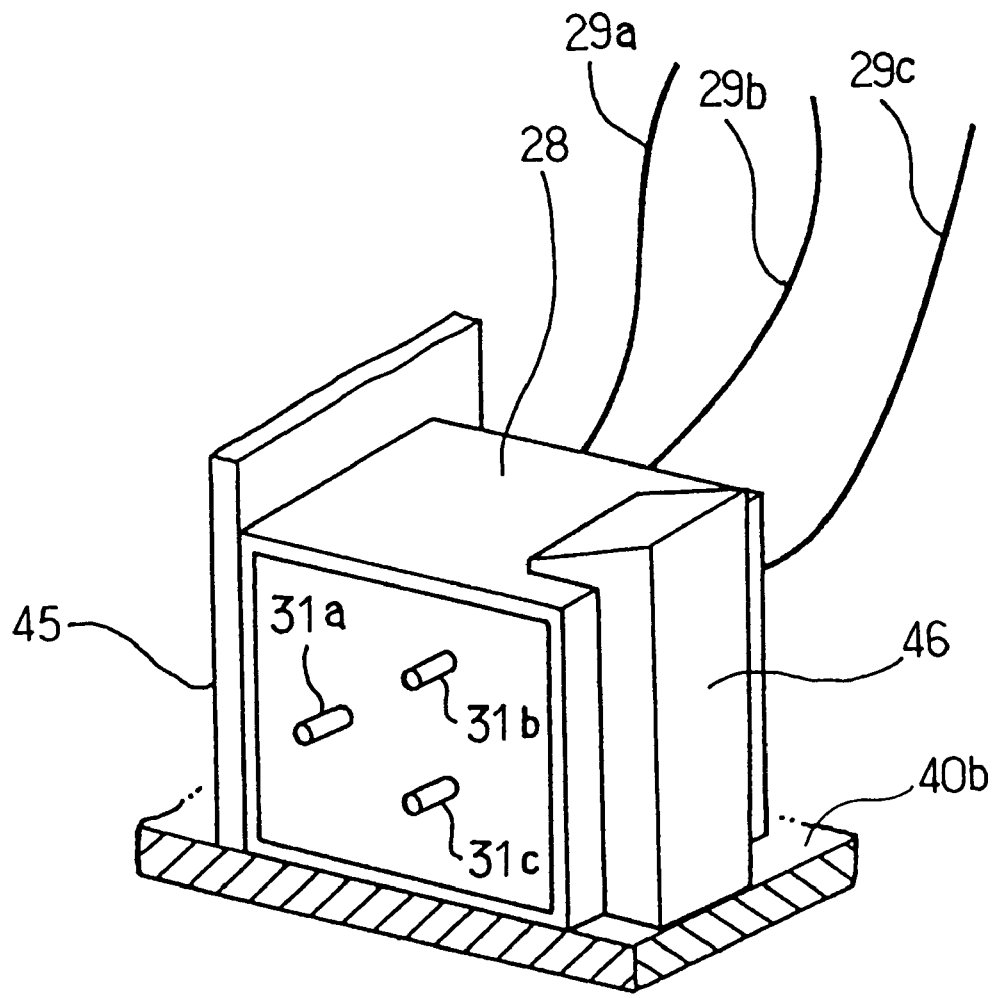
FIG. 7 is a perspective view of the coil casing fixed by a claw.

The three capacitors 24a to 24c composing the input side capacitor circuit 24 are mounted on an input side printed circuit board 33 as shown in FIG. 5. The input side printed circuit board 33 is formed with three through holes (not shown) corresponding to the pin terminals 31a to 31c respectively. The pin terminals 31a to 31c are inserted through the respective through holes and soldered so that the input side capacitor circuit 24 is electrically connected to the coils 25a to 25c. Three-phase wires 34a to 34c shown in FIG. 5 are connected to terminals of a main circuit terminal block (not shown) provided in the casing 36. The three-phase wires 34a to 34c are shown as a single relay wire 34 in FIG. 1. The pin terminals 31a to 31c are soldered such that the input side printed circuit board 33 is fixed to the coil casing 28. Besides, when further screwed to the coil casing 28, for example, the input side printed circuit board 33 can reliably be fixed to the coil casing 28.

Four capacitors 26a to 26d composing the output side capacitor circuit 26 are mounted on an output side printed circuit board 35, as shown in FIG. 5. The output side printed circuit board 35 is provided with three thread type connecting terminals 35a to 35c. The output side ends 29a to 29c of the coils 25a to 25c are connected to the connecting terminals 35a to 35c respectively so that the output side capacitor circuit 26 is electrically connected to the coils 25a to 25c.

The above-described filter circuit 19, rectifier circuit 12, inverter circuit 15, etc. are accommodated in the casing 36 made of a plastic material, for example, as shown in FIG. 6. The casing 36 includes a cooling section 37 and an accommodating section 38 defined over the cooling section 37. A fan 39 comprising an axial-flow fan, for example, is provided on one of sides of the cooling section 37. The cooling section 37 has an open side (not shown) opposed to the side on which the fan 39 is provided, although this is not shown in the drawings. A plurality of aluminum die-cast fins (not shown) are disposed in the cooling section 37 so as to be opposed to the fan 39. Upon operation of the fan 39, a cooling air is caused to flow into the cooling section 37 and absorbs heat from the fins, being discharged outside.

The accommodating section 38 includes a casing main body 40 and a cover 41 closing an upper opening of the casing main body 40. An operation panel 42 including operation switches 42a, a display 42b, etc. is provided on the cover 41. A number of vent holes 40a for heat radiation are formed in one of sides of the casing main body 40. One side of the accommodating section 38 is formed with a rectangular window 43 to which a metal plate 44 having three wiring holes 44a is attached.

Figure 1:
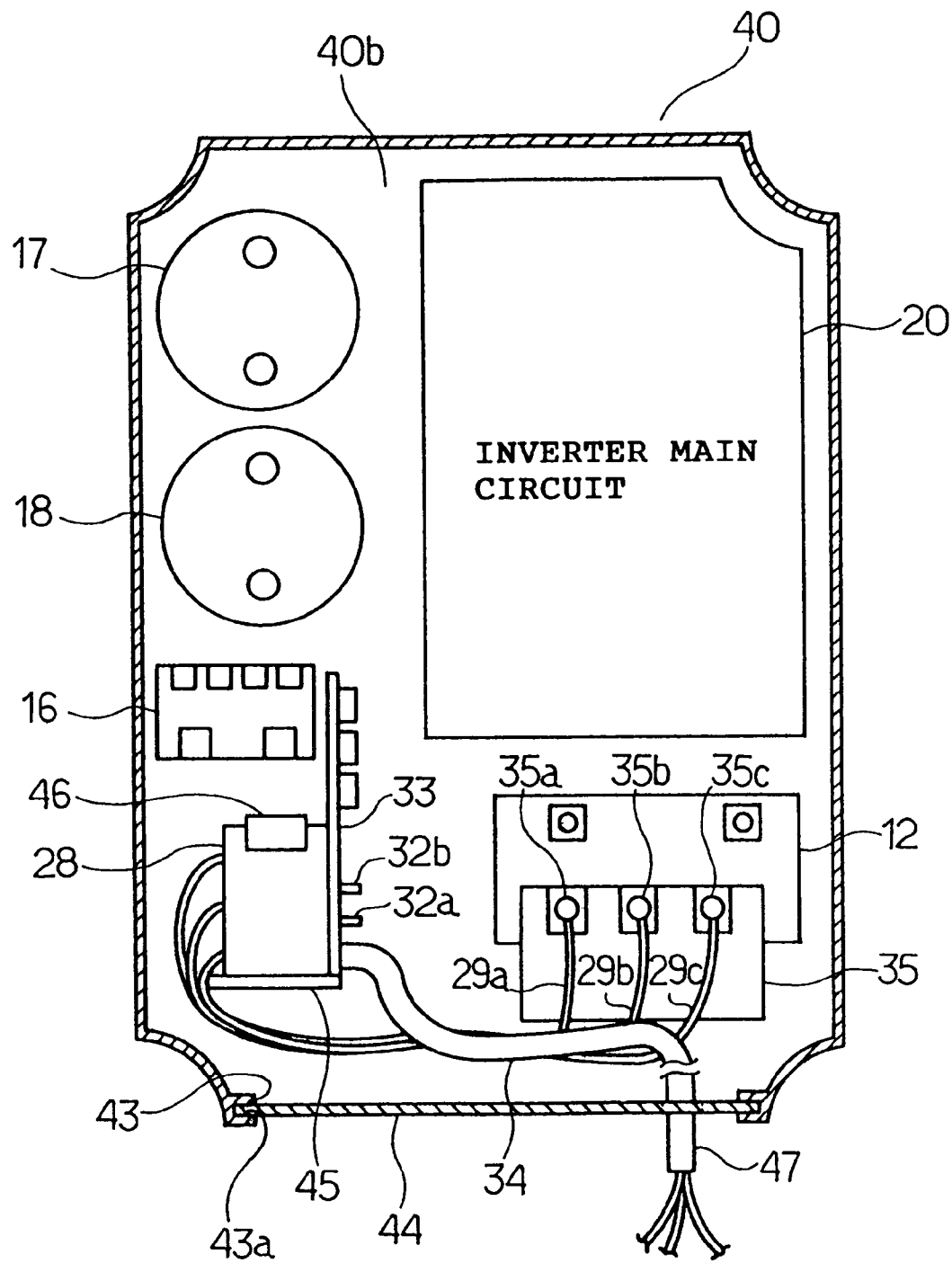
FIG. 1 is a top plan view of the inverter of a first embodiment in accordance with the present invention with a cover being removed.

FIG. 1 illustrates the casing main body 40 of the accommodating section 38 with the cover 41 being removed therefrom. A groove 43a is formed to extend over an entire inner peripheral face of the window 43. The metal plate 44 is inserted into the groove 43a of the casing main body 40 with the cover 41 being removed and thereafter, the cover 41 is fixed over the casing main body 40 with the metal plate 44 being inserted into a groove (not shown) formed in a side of the cover 41 corresponding to the window 43, whereupon the metal plate 44 is attached to the window 43. A power supply wire 47 (shown only in FIG. 1) connected at one end thereof to a power source and an output wire (not shown) connected to the inverter circuit 15 are passed through the holes 44a of the sheet metal 44 respectively. The power supply wire 47 is connected at the other end thereof to the above-described main circuit terminal block.

An inverter main circuit 20 composing the inverter circuit 15 is disposed at the upper right-hand interior of the casing main body 40, as viewed in FIG. 1. The rectifier circuit 12 is disposed below the inverter main circuit 20 in the accommodating section 38, as viewed in FIG. 1. A bottom 40b of the casing main body 40 has two rectangular openings (not shown) corresponding to the inverter main circuit 20 and the rectifier circuit 12 respectively so that the inverter main circuit and the rectifier circuit are placed on upper faces of the aluminum die-cast fins of the cooling section 37. Main circuit capacitors 17 and 18 are disposed on the left of the inverter main circuit 20 in the casing main body 40. Furthermore, a relay 16 is disposed below the main circuit capacitor 18 in the casing main body 38. The bottom 40b of the casing main body 40 is further formed with openings (not shown) corresponding to the relay 16 and the main circuit capacitors 17 and 18 respectively so that the relay 16 and the main circuit capacitors 17 and 18 are cooled by a cooling air flowing through the cooling section 37.

The filter circuit 19 is disposed in the remaining space of the casing main body 40. More specifically, the coil casing 28 accommodating the zero phase reactor 25 of the filter circuit 19 is fixed to the input side printed circuit board 33 so as to be disposed below the relay 16, as viewed in FIG. 1. The coil casing 28 is held between a wall 45 standing from the bottom 40a of the casing main body 40 and a claw 46 having elasticity so as to be reliably fixed to the casing main body 40. When the claw 46 is flexed in a direction opposite the wall 45, a space between the distal end of the claw 46 and the wall 45 is spread so that the coil casing 28 is disposed between the wall 45 and the claw 46.

The output side printed circuit board 35 is screwed by the thread type connecting terminals 35a to 35c to the package of the rectifier circuit 12, whereupon the output side capacitor circuit 26 is electrically connected to the rectifier circuit 12. The control circuit 21 is mounted on a printed circuit board together with the operation switches 42a and the display 42b, and then, the printed circuit board is fixed to the cover 41 although this is not shown in the drawings. The main circuit terminal block is disposed in the accommodating section 38 over the filter circuit 19 with a predetermined space therebetween although this is not shown. Furthermore, the bottom 40b of the casing main body 40 is formed with an opening (not shown) corresponding to the filter circuit 19 so that the filter circuit is cooled by the cooling air flowing through the cooling section 37. The cooling air in the cooling section 37 flows through the openings of the bottom 40b into the accommodating section 38, thereby cooling the components accommodated in the accommodating section 38.

According to the above-described embodiment, the filter circuit 19 is accommodated in the casing 18 together with the rectifier circuit 12 and the inverter circuit 15. Consequently, the size of the inverter can be reduced. In other words, since the filter circuit 19 is disposed nearer to the rectifier circuit 12 in the accommodating section 38, a distance for connection between the filter circuit 19 and the rectifier circuit 12 can be shortened. Accordingly, noise produced from the nodes of the filter circuit 19 and the rectifier circuit 12 can be reduced. This renders the filter circuit 19 and accordingly the inverter 11 smaller in size. Consequently, the manufacturing cost of the inverter can be reduced, and an installation space thereof can be reduced.

Particularly in the embodiment, the output side printed circuit board 35 is screwed to the package into which the rectifier circuit 12 is assembled, so that the output side capacitor circuit 26 is connected to the rectifier circuit 12. Thus, since the filter circuit 19 is connected to the rectifier circuit 12 without using a wire, a further noise reduction can be achieved.

In the zero phase reactor 25, the input side ends 32a to 32c and the output side ends 29a to 29c of the respective coils 25a to 25c extend in the directions differing from each other. Accordingly, since the input side capacitor circuit 24 and output side capacitor circuit 26 of the filter circuit 19 can be separated from each other, superimposition of noise from the output side to the input side of the filter circuit 19 can be prevented. Consequently, a reduction in the noise eliminating performance of the filter circuit 19 can be prevented even when the filter circuit is incorporated in the casing 36.

The input side ends 32a to 32c of the zero phase reactor 25 are connected to the pin terminals 31a to 31c respectively. The pin terminals 32a to 32c are further inserted through the holes of the input side printed circuit board 33 so that the zero phase reactor 25 is connected to the input side printed circuit board 33. Consequently, no wire is required for connecting the zero phase reactor 25 to the input side printed circuit board 33, and the coil casing 28 can readily be attached to the input side printed circuit board 33.

The output side ends 29a to 29c of the zero phase reactor 25 are formed into the wire shape by extending the wire material of the coils 25a to 25c. Since this allows the output side printed circuit board 35 to be separated from the coil casing 28, the input and output side printed circuit boards 33 and 35 can reliably be separated from each other. Furthermore, the layout of the coil casing 28 and the output side printed circuit board 35 can be altered according to the accommodating space for the filter circuit 19 in the accommodating section 38.

The output side printed circuit board 35 is screwed to the rectifier circuit 12. This can compact the output side printed circuit board 35 and the rectifier circuit 12. Moreover, since the filter circuit 19 is connected to the rectifier circuit 12 without using a wire, a further noise reduction can be achieved.

The output side ends 29a to 29c of the zero phase reactor 25 extend through the annular zero phase inductor core 30. Consequently, the noise can further be reduced by the zero phase inductor core 30. In the foregoing embodiment, the zero phase inductor core 30 is disposed in the coil casing 28 to be located inside the zero phase reactor 25. Consequently, no specific accommodating space dedicated to the core 30 is required in the accommodating section 38, and accordingly, the casing 36 and the inverter 11 can further be rendered smaller.

FIGS. 9 and 10 illustrate a second embodiment of the invention. The differences of the second embodiment from the first embodiment will be described. The identical parts and components in the second embodiment are labeled by the same reference symbols as in the first embodiment. In the second embodiment, the zero phase inductor core 51 is bonded to a side of the metal plate 44 facing the inside of the accommodating section 38, instead of the zero phase inductor core 30 accommodated in the coil casing 28. In this case, the core 51 is fixed to the metal plate 44 to correspond with one of the three holes 44a of the metal plate 44, as shown in FIG. 10. Accordingly, when inserted through the hole 44a, the power supply wire 47 can also pass through the zero phase inductor core 51. Thus, the efficiency in passing the power supply wire 47 through the core 51 can be improved as compared with the case where the core 51 is inserted to be located at a middle portion of the power supply wire 47. Furthermore, since the core 51 is fixed to the metal plate 44, a space near the metal plate 44 can utilized as an accommodating space for the core 51.

FIGS. 11 to 15 illustrate a third embodiment of the invention. The differences of the third embodiment from the first embodiment will be described. The identical parts and components in the third embodiment are labeled by the same reference symbols as in the first embodiment. In the third embodiment, the invention is applied to a small-sized inverter having a current capacity ranging between 0.75 and 4 kW.

Figure 11:
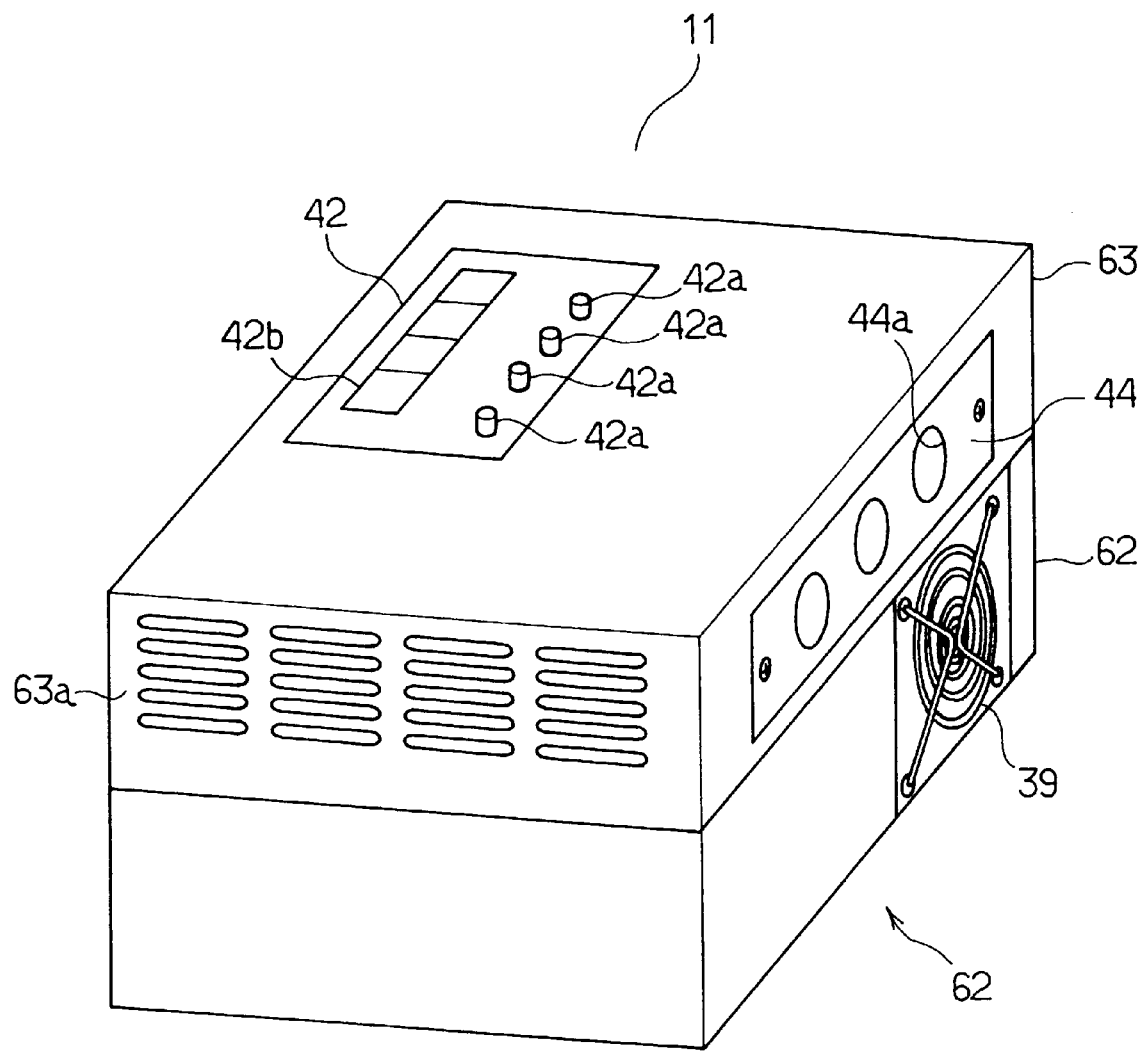
FIG. 11 is a view similar to FIG. 6, showing the inverter of a third embodiment in accordance with the present invention.

Referring to FIG. 11, the inverter 11 is accommodated in a casing 61 provided instead of the casing 36. The casing 61 includes a cooling casing 62 and the plastic accommodating section 63 disposed on the cooling casing 62.

The construction of the cooling casing 62 and the accommodating section 63 will be described with reference to FIGS. 12 to 14. The cooling casing 62 includes a fin section 65 serving as a first cooling chamber and a filter circuit accommodating section 66 serving as a second cooling chamber. The fin section 65 and the filter circuit accommodating section 66 are partitioned by a partition wall 64. The partition wall 64 is formed with, for example, two vent holes 67 and 68 through which the fin section 65 communicates with the filter circuit accommodating section 66. A fan 39 is mounted on a side of the cooling casing 62 corresponding to the fin section 65.

The fin section 65 has an open side opposed to the side on which the fan 39 is mounted and an open bottom. The fin section 65 further has a ceiling on which a plurality of flat heat-radiating fins 69 are integrally formed so as to be parallel to the partition wall 64. A guide plate 70 serving as a guide member is mounted on a side face of the partition wall 64 at the fin section 65 side so as to be disposed nearer to the vent hole 67 than to the vent hole 68 between them. Upon drive of the fan 39, a cooling air is caused to flow into the fin section 65. A part of the cooling air strikes against the guide plate 70 to thereby be directed to the vent hole 67 side, whereas the other part of the cooling air passes through a space between each one heat-radiating fin 69 and the adjacent one. The cooling air flowing through the vent hole 67 into the filter circuit accommodating section 66 is caused to return through the other vent hole 68 into the fin section 65.

The filter circuit accommodating section 66 has an open top and accommodates therein a filter circuit board 71 on which the filter circuit 19 is mounted. The zero phase reactor 25 is mounted on the central portion of the filter circuit board 71. Only the core 27 of the zero phase reactor 25 is shown and the coils 25a to 25c thereof are eliminated. The input and output side capacitors 24 and 26 are mounted respectively on the right-hand and left-hand portions of the filter circuit board 71 with the zero phase reactor 25 being located therebetween.

Figure 15:
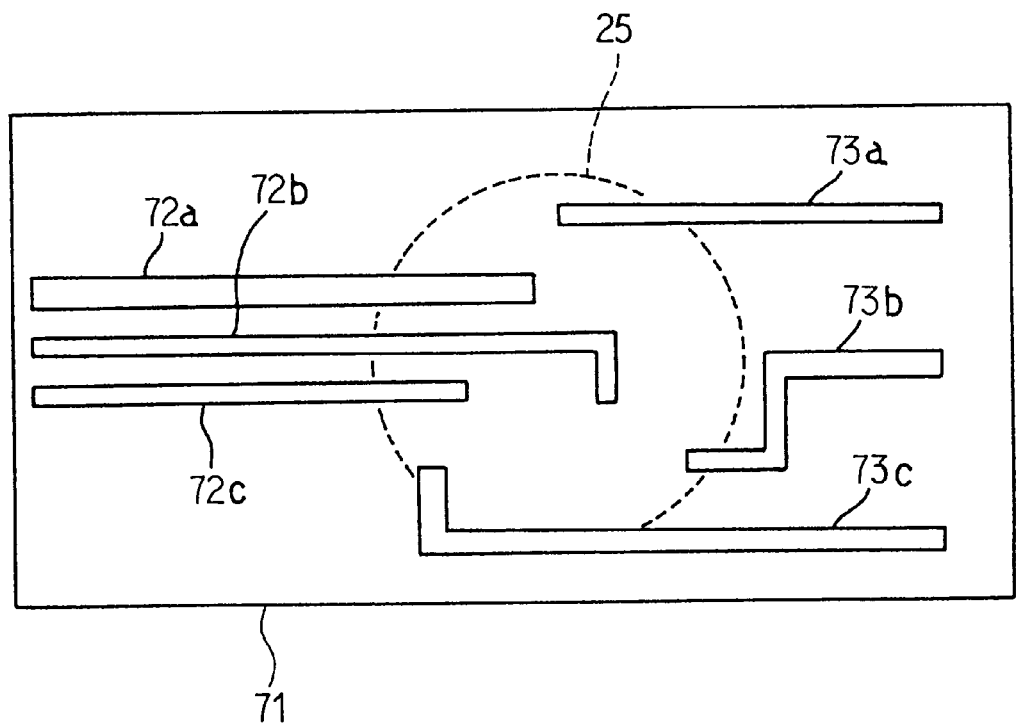
FIG. 15 shows a wiring pattern of the filter circuit.

The filter circuit board 71 is formed with input side wiring patterns 72a to 72c via which the respective input side ends 32a to 32c (see FIG. 2) of the zero phase reactor 25 are connected to the input side capacitor circuit 24, as shown in FIG. 15. The filter circuit board 71 is further formed with output side wiring patterns 73a to 73c via which the respective output side ends 29a to 29c (see FIG. 2) of the zero phase reactor 25 are connected to the output side capacitor circuit 26. Accordingly, the input side of the filter circuit 19 is also separated from the output side thereof.

The accommodating section 63 is formed into a rectangular box having an open underside and covers the top face of the cooling casing 62. One side of the accommodating section 63 has an oblong window (not shown). The metal plate 44 is screwed to the accommodating section 63 so as to close the window, as shown in FIG. 11. Another side of the accommodating section 63 is formed with a number of vent holes 63a. The operation panel 42 including the operation switches 42a, the display 42b, etc. is mounted on the top of the accommodating section 63.

Figure 12:
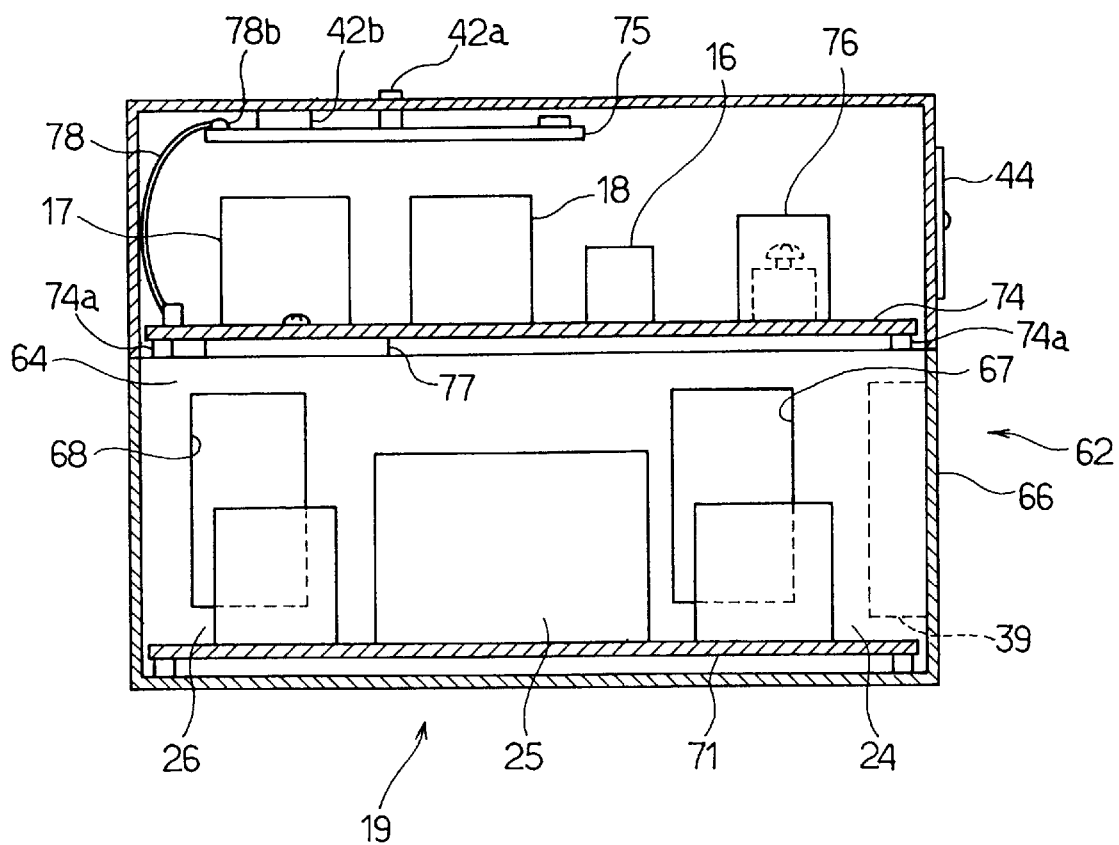
FIG. 12 is a longitudinal side section of the casing.
Figure 13:
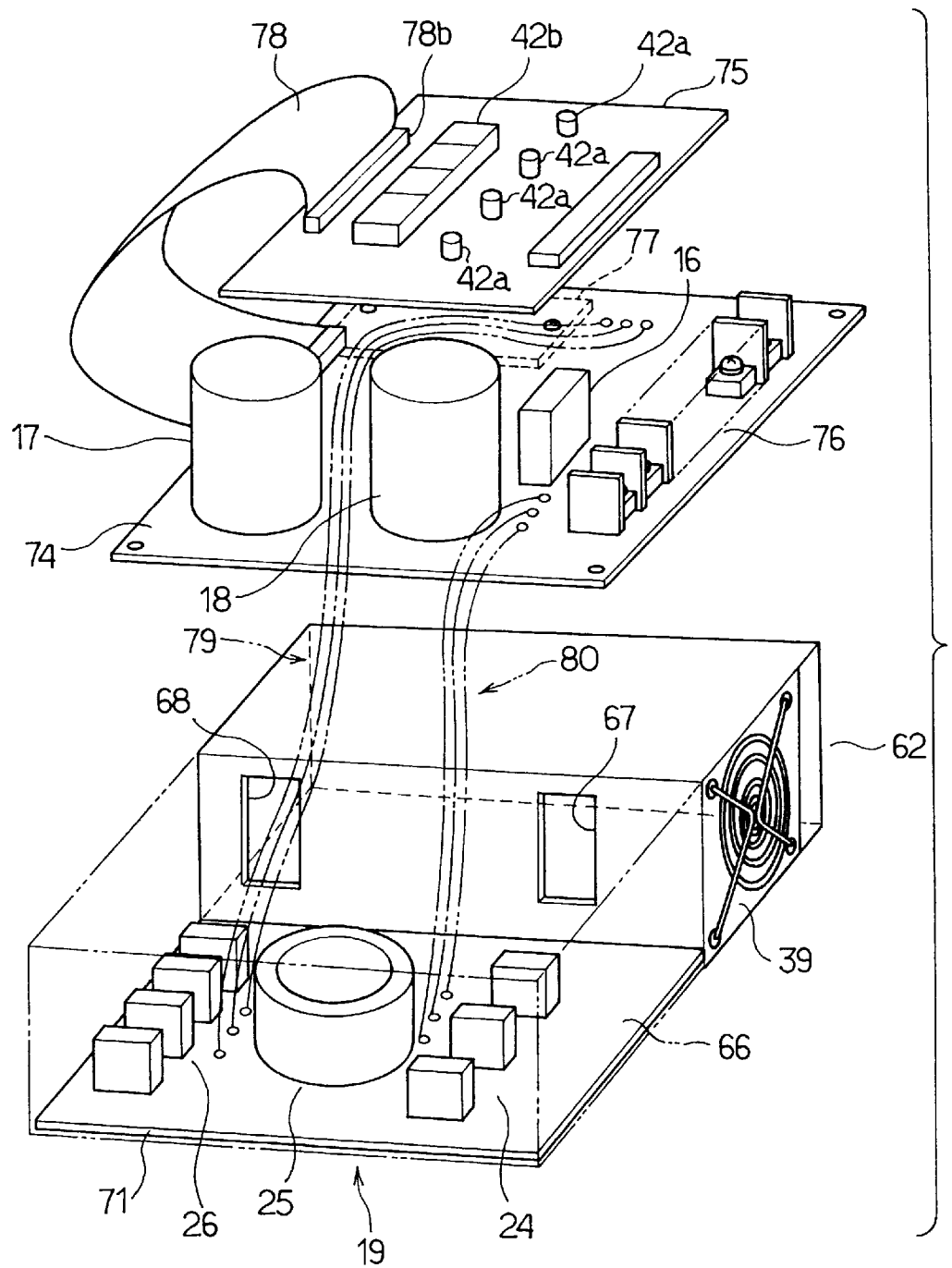
FIG. 13 is an exploded perspective view of the casing and an accommodating section of the inverter.
Figure 14:
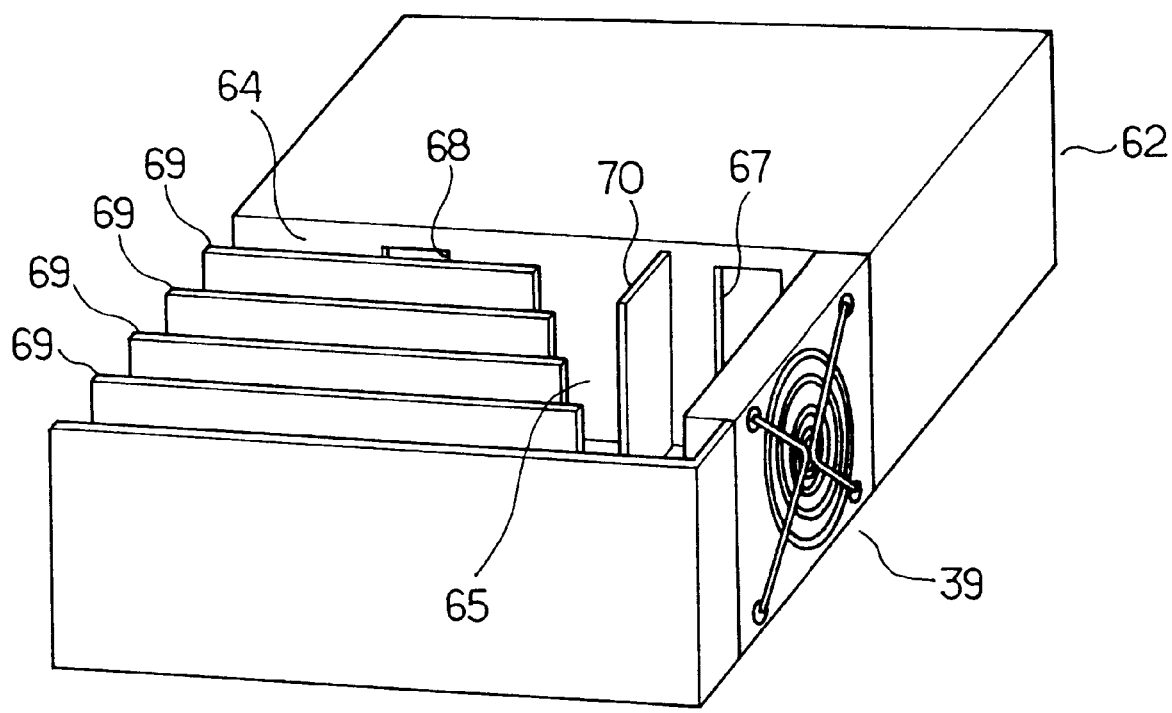
FIG. 14 is a perspective view of aluminum die-cast fins as viewed from the rear of the inverter.

A drive circuit board 74 and a control circuit board 75 are provided in the accommodating section 63 as shown in FIGS. 12 and 13. The drive circuit board 74 is screwed to the top of the cooling casing 62 with spacers 74a (shown only in FIG. 12) being interposed therebetween. Accordingly, the upper opening of the filter circuit accommodating section 66 of the cooling casing 62 is covered by a half part of the drive circuit board 74.

The relay 16, the main circuit capacitors 17 and 18, and the main circuit terminal block 76 are mounted on the upper face of the drive circuit board 74. A flat package 77 on which the inverter main circuit 20 and the rectifier circuit 12 are provided by way of molding is mounted on the underside of the drive circuit board 74. The package 77 is screwed to the upper faces of the fin sections to be closely attached thereto so that heat radiated from the fin section 65 is efficiently transmitted to the fin section 65. Connecting wires 79 connecting between the rectifier circuit 12 and the filter circuit 19 and relay wires 80 connecting between the filter circuit 19 and the main circuit terminal block 76 are further connected between the drive circuit board 74 and the filter circuit board 71.

Furthermore, the control circuit board 75 is screwed to the ceiling of the accommodating section 63. The control circuit board 75 is electrically connected to the drive circuit board 74 via a connecting cable 78 further connected to a connector 78a at the drive circuit board 74 side and a connector 78b at the control circuit board 75 side. The operation switches 42a, the display 42b and the control terminal block 79 are mounted on the control circuit board 75.

Figure 16:
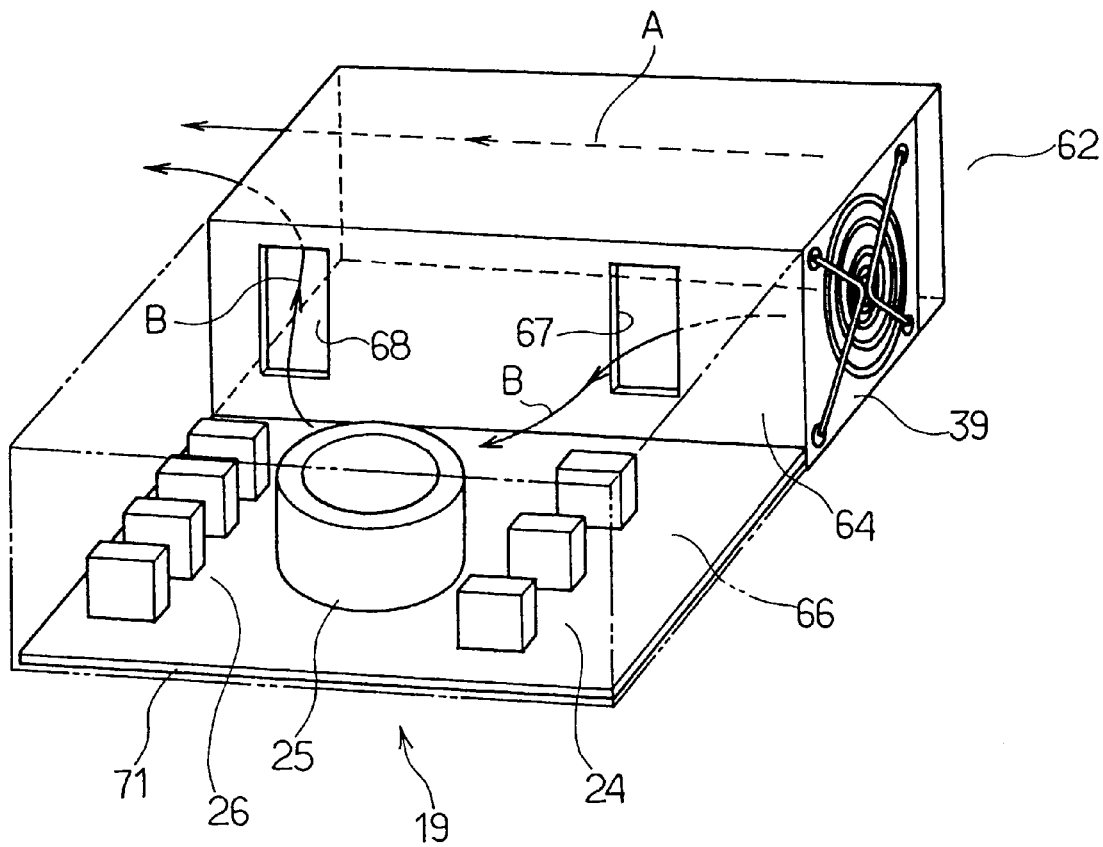
FIG. 16 shows flow paths of cooling air in the aluminum die-cast fins.

According to the third embodiment, the inverter circuit 20 and accordingly, the package 77 heat up with drive of the inverter 11. Furthermore, the cooling air flows into the fin section 65 upon drive of the fan 39 as shown by arrow A in FIG. 16. A part of the cooling air flows through the space between each one heat-radiating fin 69 and the adjacent one. Since the package 77 is closely attached to the upper face of the fin section 65, the heat generated by the package 77 is efficiently transferred to the fin section 65, whereupon the heat is radiated to the cooling air flowing through the space between each one heat-radiating fin 69 and the adjacent one.

Upon drive of the inverter 11, the filter circuit 19 and particularly, the zero phase reactor 25 heat up. A part of the cooling air flowing into the fin section 65 is guided by the guide plate 70 to thereby flow through the vent hole 67 into the filter circuit accommodating section 66 as shown by arrow B in FIG. 16 and to further flow through the vent hole 68 to the fin section 65 side. Consequently, the filter circuit 19 can be cooled by the cooling air flowing through the filter circuit accommodating section 66.

In the third embodiment, the cooling casing 62 is divided into the fin section 65 and the filter circuit accommodating section 66. The inverter circuit 15 and the rectifier circuit 12 are cooled by the cooling air flowing through the fin section 65, and the filter circuit 19 is cooled by the cooling air flowing through the filter circuit accommodating section 66. Consequently, the filter circuit 19 can sufficiently be cooled together with the inverter main circuit 20 and the rectifier circuit 12 even when the filter circuit 19 is accommodated in the casing 61 with the inverter circuit 15 and the rectifier circuit 12.

Figure 17:
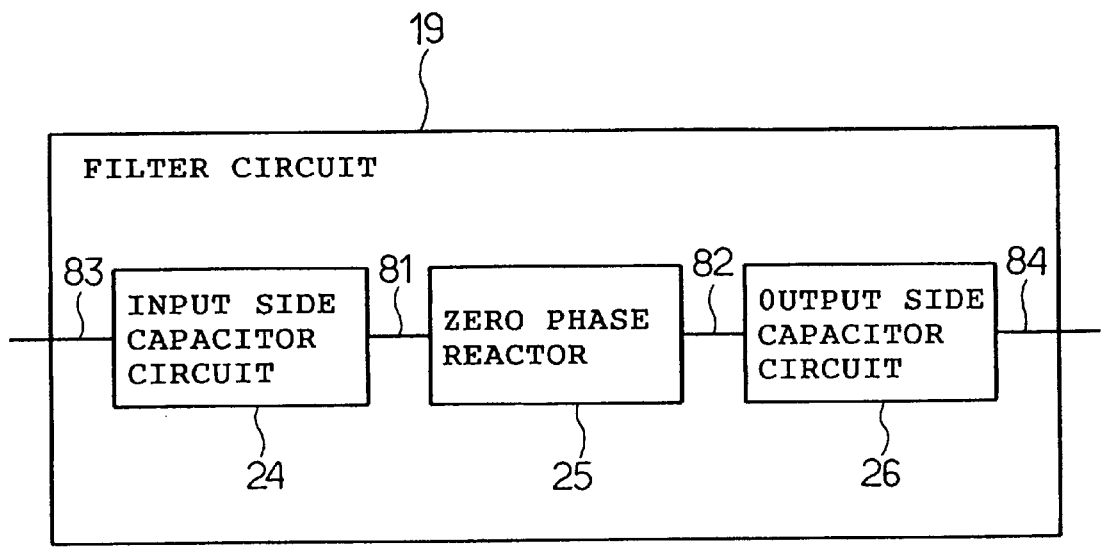
FIG. 17 schematically illustrates a modified form of the filter circuit.
Figure 18:
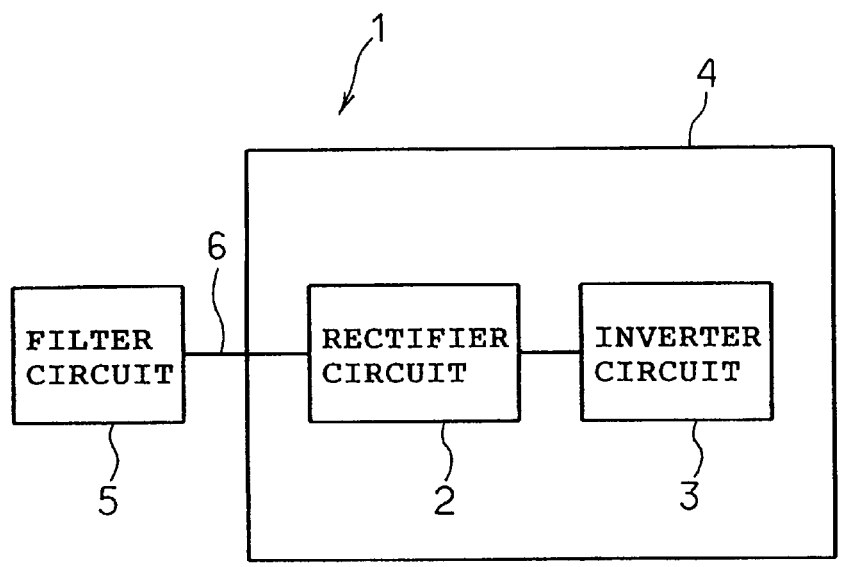
FIG. 18 schematically illustrates a conventional arrangement of the inverter and the filter circuit.

The invention should not be limited by the embodiments described above with reference to the accompanying drawings. The invention may be practiced in the following modified forms. The zero phase inductor core 30 or 51 is disposed so that the output side ends 29a to 29c pass therethrough or so that the power supply wire 47 passes therethrough. However, as shown in FIG. 17, the zero phase inductor core 30 may be disposed so that a wire 81 or 82 connecting the zero phase reactor 25 to the input side capacitor circuit 24 and the output side capacitor circuit 26 respectively passes therethrough or so that a wire 83 connecting the filter circuit 19 to the power supply or a wire 84 connecting the the filter circuit 19 to the rectifier circuit 12 passes therethrough. In each case, the same noise reduction can be achieved. Furthermore, in the foregoing third embodiment, the zero phase inductor core may be disposed so that a suitable wire passes therethrough.

In the first and second embodiments, the input side ends 32a to 32c of the coils 25a to 25c may be formed into the shape of the wire so that the coil casing 28 and the input side printed circuit board 33 are connected in a physically spaced away relation. Furthermore, the output terminals 29a to 29c may be formed into the shape of the pin so that the coil casing 28 and the output side printed circuit board 35 are directly connected together.

The number of the capacitors in each of the input and output side capacitor circuits 24 and 26 should not be limited to three or four. Another suitable number of the capacitors may be provided. Additionally, the number of the vent holes 17 and 18 should not be limited to two. Three or more vent holes may be provided.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

I claim:

1. An inverter circuit comprising:

a rectifier circuit;

an inverter circuit;

an input side printed circuit board;

an output side printed circuit board;

a filter circuit including an input side capacitor mounted on the input side printed circuit board, a coil, and an output side capacitor mounted on the output side printed circuit board, the filter circuit being disposed at a front stage of the rectifier circuit, the coil having an input side end and an output side end both extending in directions differing from each other, one of the input and output side ends of the coil being formed into the shape of a wire by extending a wire material of the coil; and a casing accommodating the rectifier circuit, the inverter circuit and the filter circuit which further comprises an input side printed circuit board on which the input side capacitor is mounted, an output side printed circuit board on which the output side capacitor is mounted, and wherein one of the input and output side ends of the coil is formed into the shape of a pin, and the other end is formed into the shape of a wire by extending a wire material of the coil.

2. An inverter according to claim 1, wherein the output side printed circuit board is integrally mounted on the rectifier circuit.

3. An inverter according to claim 1, which further comprises an annular core for a zero phase inductor, and wherein any one of a power supply wire connected to the input side printed circuit board, a wire or wires connecting between the input and output side printed circuit boards, and an output wire connected to the output side printed circuit board passes through the core.

4. An inverter according to claim 2, which further comprises an annular core for a zero phase inductor, and wherein any one of a power supply wire connected to the input side printed circuit board, a wire or wires connecting between the input and output side printed circuit boards, and an output wire connected to the output side printed circuit board passes through the core.

5. An inverter according to claim 3, which further comprises a coil casing for accommodating the coil, and wherein the core is accommodated in the coil casing.

6. An inverter according to claim 4, which further comprises a coil casing for accommodating the coil, and wherein the core is accommodated in the coil casing.

7. An inverter according to claim 3, wherein the casing has a through hole through which the power supply wire or the output wire extending from the inverter circuit passes, and the core is disposed in the casing to correspond with the through hole of the casing.

8. An inverter according to claim 4, wherein the casing has a through hole through which the power supply wire or the output wire extending from the inverter circuit passes, and the core is disposed in the casing to correspond with the through hole of the casing.

9. An inverter according to claim 5, wherein the casing has a claw for fixing the coil casing thereto.

10. An inverter according to claim 6, wherein the casing has a claw for fixing the coil casing thereto.

11. An inverter comprising:

a rectifier circuit;

an inverter circuit;

a filter circuit including an input side capacitor, a coil, and an output side capacitor, the filter circuit being disposed at a front stage of the rectifier circuit;

a casing accommodating the rectifier circuit, the inverter circuit and the filter circuit;

a first cooling chamber defined in the casing;

a second cooling chamber defined in the casing and partitioned by a partition wall from the first cooling chamber to be adjacent thereto;

a plurality of vent holes formed in the partition wall; and a fan for supplying a cooling air into the first cooling chamber and further via the vent holes into the second cooling chamber; and wherein the inverter circuit is cooled by the cooling air flowing into the first cooling chamber and the coil of the filter circuit is cooled by the cooling air flowing through the second cooling chamber.

12. An inverter according to claim 11, which further comprises a guide member for guiding the cooling air supplied from the fan into the second cooling chamber, the guide member being disposed in the vicinity of any one of the vent holes at a side of the partition wall facing the first cooling chamber.

13. An inverter comprising:

a rectifier circuit;

an inverter circuit;

a filter circuit including an input side capacitor, a coil, and an output side capacitor, the filter circuit being disposed at a front stage of the rectifier circuit;

a cooling casing having a first cooling chamber and a second cooling chamber partitioned by a partition wall to be adjacent each other, the partition wall having a plurality of vent holes; and a fan for supplying a cooling air into the first cooling chamber and further via the vent holes into the second cooling chamber so that the inverter circuit is cooled by the cooling air flowing into the first cooling chamber and the coil of the filter circuit is cooled by the cooling air flowing through the second cooling chamber.

14. An inverter according to claim 13, which further comprises a guide member for guiding the cooling air supplied from the fan into the second cooling chamber, the guide member being disposed in the vicinity of any one of the vent holes at a side of the partition wall facing the first cooling chamber.

* * * * *